(12) United States Patent
Michal

(10) Patent No.: US 11,994,537 B2
(45) Date of Patent: May 28, 2024

(54) FLOATING VOLTAGE MEASURING CIRCUIT AND METHOD

(71) Applicant: STMicroelectronics (Grenoble 2) SAS, Grenoble (FR)

(72) Inventor: Vratislav Michal, Fontanil Cornillon (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 208 days.

(21) Appl. No.: 17/743,785

(22) Filed: May 13, 2022

(65) Prior Publication Data

US 2022/0390490 A1    Dec. 8, 2022

(30) Foreign Application Priority Data

May 27, 2021  (FR) ...................... 2105515

(51) Int. Cl.
*G01R 15/16*   (2006.01)
*G01R 19/00*   (2006.01)

(52) U.S. Cl.
CPC ......... *G01R 15/16* (2013.01); *G01R 19/0084* (2013.01)

(58) Field of Classification Search
CPC ........ G01R 15/00; G01R 15/14; G01R 15/16; G01R 19/00; G01R 19/0084; G01R 19/0092

USPC ...................................... 324/76.11
See application file for complete search history.

(56) References Cited

U.S. PATENT DOCUMENTS

| 11,190,104 B2 * | 11/2021 | Hu ............... H02M 3/33523 |
| 2020/0158762 A1 | 5/2020 | Wilson et al. |
| 2023/0134427 A1 * | 5/2023 | Liu .................. H02M 3/07 323/271 |

FOREIGN PATENT DOCUMENTS

| CN | 113572242 A | * | 10/2021 | ............ H02J 7/0013 |
| CN | 114966158 A | * | 8/2022 | ............ G01R 15/18 |
| DE | 102011002621 A1 | | 7/2012 | |

* cited by examiner

*Primary Examiner* — Hoai-An D. Nguyen
(74) *Attorney, Agent, or Firm* — Slater Matsil, LLP

(57) ABSTRACT

In an embodiment, a circuit includes a first branch coupled between a first node and a second node, the first branch including a first ceramic capacitor, the first ceramic capacitor including terminals configured to receive a first voltage applied therebetween. The circuit further includes a second branch coupled between the first node and a third node, the second branch including a second ceramic capacitor that is substantially identical to the first ceramic capacitor, the second ceramic capacitor including terminals configured to receive a second voltage applied therebetween. The circuit further includes a control circuit configured to modify the second voltage until a first current passing through the second node is substantially equal to a second current passing through the third node.

20 Claims, 5 Drawing Sheets

FLOATING VOLTAGE MEASURING CIRCUIT AND METHOD

CROSS-REFERENCE TO RELATED APPLICATIONS

This application claims priority to French Application No. FR2105515, filed on May 27, 2021, which application is hereby incorporated herein by reference.

TECHNICAL FIELD

The present disclosure relates generally to measuring circuits and, in particular embodiments, to a measuring circuit for a floating high voltage source and a method for measuring a floating high voltage source.

BACKGROUND

Floating voltage sources may be utilized to provide a substantially precise voltage in an electronic circuit. Such floating voltage sources add or subtract a predetermined voltage to a voltage level of a sensor operating on a different voltage level than a signal processing (readout) circuit. Measuring a floating voltage is complex, as the measuring device may modify the value of the floating voltage, and eventual continuous (DC) voltage can harm the functionality of the system.

SUMMARY

There is a need for a measuring circuit for a floating voltage of which the value is unaffected by the measuring circuit.

Embodiments may address all or some of the drawbacks of other sensing circuits for measuring a floating high voltage source.

One embodiment provides a circuit for measuring a first voltage comprising: a first branch coupled between a first node and a second node, the first branch comprising a first ceramic capacitor, the first voltage being applied across the terminals of the first ceramic capacitor; and a second branch coupled between the first node and a third node, the second branch comprising a second ceramic capacitor, identical to the first ceramic capacitor, a second voltage being applied across the terminals of the second ceramic capacitor, the circuit being configured to modify the value of the second voltage until a first current passing through the second node is substantially equal to a second current passing through the third node.

Another embodiment provides a method of measuring, by a circuit, a first voltage, applied across the terminals of a first ceramic capacitor, the method comprising: applying a second voltage across the terminals of a second ceramic capacitor, identical to the first ceramic capacitor, the first capacitor being part of a first branch coupled between a first node and a second node and the second ceramic capacitor being part of a second branch coupled between the first node and a third node; modifying the second voltage until a first current passing through the second node is substantially equal to a second current passing through the third node.

According to an embodiment, the first and second branches are identical to each other.

According to an embodiment, the first branch comprises a third capacitor coupled in series with the first ceramic capacitor between the first and second nodes and the second branch comprises a fourth capacitor coupled in series with the second ceramic capacitor between the first and third nodes.

According to an embodiment, the third and fourth capacitors are identical to each other.

According to an embodiment, the first node is coupled to a source of alternating voltage.

According to an embodiment, the circuit comprises a comparison circuit coupled to the second and third nodes, configured to generate a third voltage representative of the difference between the first and second currents.

According to an embodiment, the comparison circuit comprises a further circuit generating a third current substantially equal to the difference between the first and second currents and an integrator circuit receiving the third current as an input.

According to an embodiment, the circuit further comprises: a first resistor and a first capacitor coupled in parallel between the second node and a fourth node; a second resistor and a second capacitor coupled in parallel between the third node and the fourth node; and an operational amplifier comprising an inverting input coupled to the second node, a non-inverting input coupled to a reference node, and an output coupled to the fourth node, the first and second resistors having a same resistance as each other and the first and second capacitors having a same capacitance as each other.

According to an embodiment, the circuit comprises a control circuit configured to generate the second voltage, and to modify the value of the second voltage according to the difference between the values of the first and second currents.

According to an embodiment, the control circuit comprises a phase discriminator and an error amplifier.

According to an embodiment, the phase discriminator comprises a resistor coupled between a fifth node of application of the third voltage and a transistor coupled between the fifth node and a reference node, the control signal of the transistor being a binary periodic signal having the frequency and the phase of the source of alternating voltage.

According to an embodiment, the first voltage is a floating voltage.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION OF ILLUSTRATIVE EMBODIMENTS

Like features have been designated by like references in the various figures. In particular, the structural and/or functional features that are common among the various embodiments may have the same references and may have identical structural, dimensional and material properties.

For the sake of clarity, only the operations and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front," "back," "top," "bottom," "left," "right," etc., or to relative positional qualifiers, such as the terms "above," "below," "higher," "lower," etc., or to qualifiers of orientation, such as "horizontal," "vertical," etc., reference is made to the orientation shown in the figures.

Unless specified otherwise, the expressions "around," "approximately," "substantially" and "in the order of" signify within 10%, and preferably within 5%.

Figure 1:
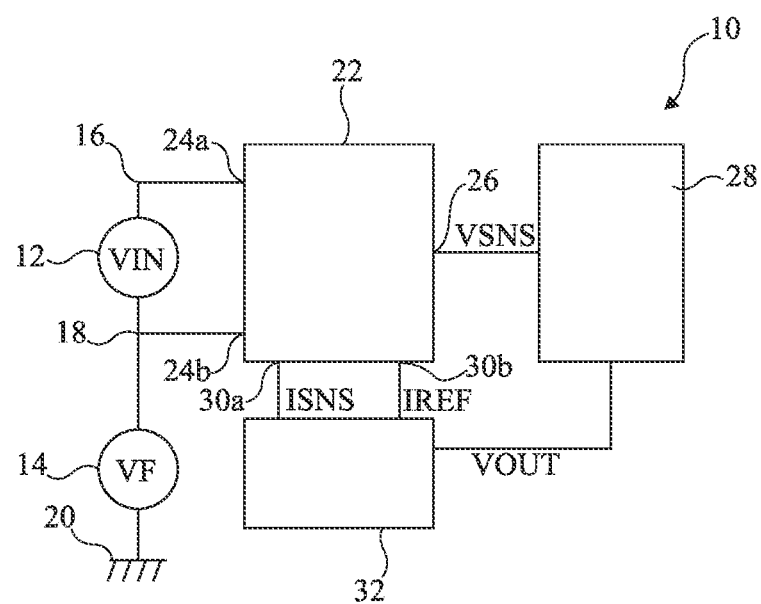
FIG. 1 schematically illustrates an embodiment of a sensing circuit for a floating high voltage source.

FIG. 1 schematically illustrates an embodiment of a sensing circuit 10 for a floating, e.g., high, voltage source.

FIG. 1 represents two voltage sources 12 and 14 in order to illustrate a floating, e.g., high, voltage source. The two voltage sources are coupled, preferably connected, in series. Voltage source 14 can alternatively be absent when the measured voltage VIN is fully floating, in other words galvanically isolated.

The source 12 is coupled between a node 16 and a node 18. In other words, a terminal of the source 12 is coupled, preferably connected, to the node 16 and another terminal of the source 12 is coupled, preferably connected, to the node 18. The source 12 provides across its terminals a floating voltage VIN. The value of the voltage VIN is the value that is to be determined by the circuit 10. The value of the voltage VIN is for example a high value, for example over 5 V, preferably over 10 V. In this context, a "floating voltage" is a voltage provided by a voltage source having neither of its terminals connected to a reference node 20.

The source 14 is coupled between the node 18 and a node 20. In other words, a terminal of the source 14 is coupled, preferably connected, to the node 18 and another terminal of the source 14 is coupled, preferably connected, to the node 20. A reference voltage is applied on the node 20, for example the ground. The source 14 provides across its terminals a voltage VF. The value of the voltage VF may for example be unknown.

The sensing circuit 10 comprises a circuit 22 configured to receive, across two input nodes 24a and 24b, the voltage VIN. In other words, the input node 24a is coupled, preferably connected, to the node 16 and the input node 24b is coupled, preferably connected, to the node 18. The circuit 22 comprises two output nodes 30a and 30b. The circuit 22 is further configured to receive, on an input node 26, a voltage VSNS, generated by a circuit 28. The voltage VSNS is for example referenced against the nodes 30a and 30b, which constitute a virtual ground. In other words, an output node of the circuit 28, on which is generated the voltage VSNS, is coupled, preferably connected, to the input node 26 of the circuit 22. The circuit 22 provides, through the output node 30a an alternative (AC) current ISNS, and through the node output 30b, an AC current IREF.

The voltage VSNS is variable. When the voltage VSNS is substantially equal to the voltage VIN, the circuit 22 is configured to provide the AC currents ISNS and IREF having substantially equal values. When the voltage VSNS is different from the voltage VIN, the circuit 22 is configured to provide the current ISNS and IREF having different values. Therefore, by comparing the currents IREF and ISNS, and knowing the value of the voltage VSNS when the currents IREF and ISNS are equal, it is possible to determine the value of the voltage VIN, which is equal to the voltage VSNS.

The circuit 22 is based on ceramic capacitors. More precisely, the circuit 22 comprises two identical branches in parallel, each one comprising a ceramic capacitor, for example a sensing ceramic capacitor, the ceramic capacitors being identical in both branches. By two identical branches, it is meant two branches comprising the same identical electronical components. By two identical ceramic capacitors, it is meant two capacitors having substantially the same dimensions, and having, after manufacturing, substantially the same capacitance and the same capacitance derating. The voltage VIN is applied across the terminals of a first of the ceramic capacitors, located in a first branch, and the voltage VSNS is applied across the terminal of a second of the ceramic capacitors, located in a second branch. The first of the ceramic capacitors is coupled between a node of the circuit 22 and the output 30a and the second ceramic capacitor is coupled between the same node and the output 30b. The current ISNS corresponds to the current flowing in the second branch and the current IREF is the current flowing in the first branch.

Figure 2:
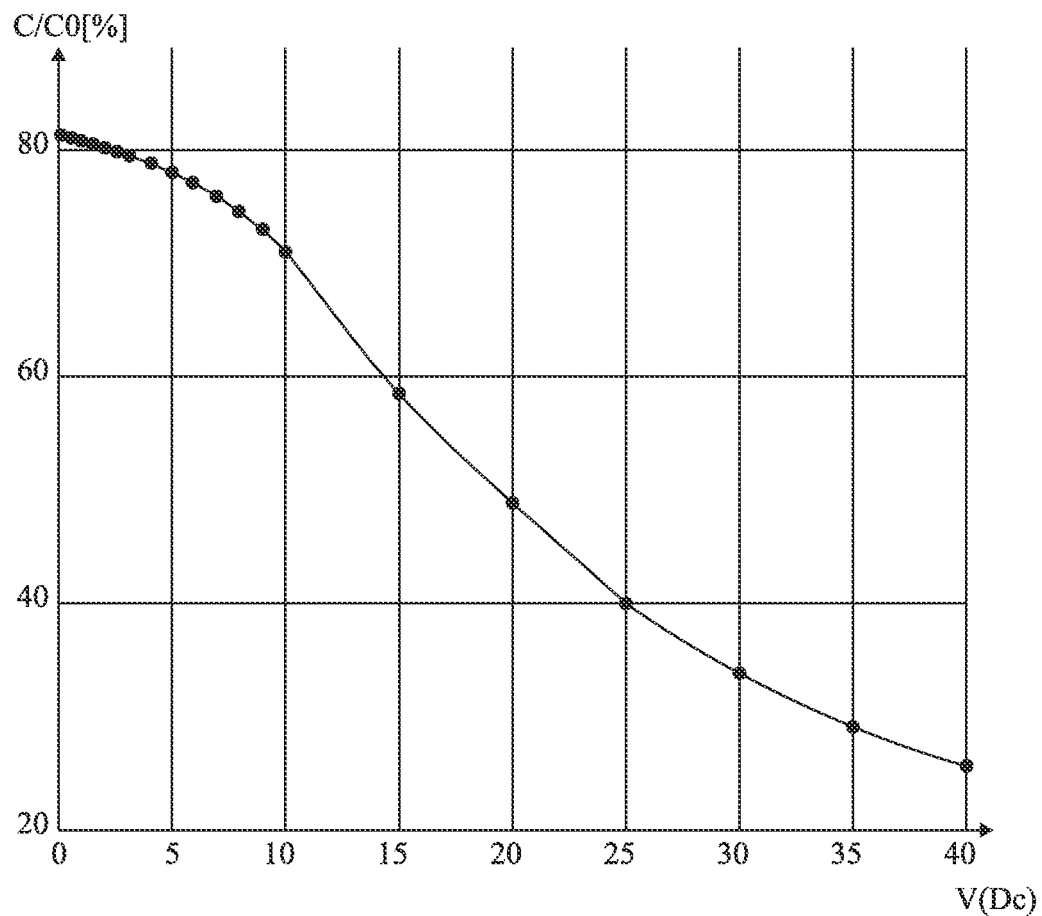
FIG. 2 is a graph illustrating the behavior of capacitance derating of a ceramic capacitor, as a function of DC voltage at the terminals of the capacitor.

FIG. 2 is a graphical illustration the behavior of the capacitance C, or more precisely the capacitor derating C/Co[%], of a ceramic capacitor as a function of the continuous (DC) voltage, in volts, (V(DC)) across the terminals of the capacitor.

The value of the capacitance of a ceramic capacitor is variable and dependent on the DC voltage across its terminals. In the example of this ceramic capacitor, the value of the capacitance of the ceramic capacitor is decreasing when the value of the continuous voltage across the terminals of the ceramic capacitor increases.

This phenomenon is particularly true for higher values of the DC voltage. Indeed, the slope of the decrease of the capacitance is higher for higher values of DC voltage, for example for values of DC voltage higher than 5 V.

This phenomenon is not significantly present for an alternating (AC) voltage applied across the terminals of the capacitor, if the AC voltage is relatively small.

Referring again to FIG. 1, when the value of the voltage VSNS of FIG. 1 across the terminals of the second ceramic capacitor is substantially equal to the value of the voltage VIN across the terminals of the first ceramic capacitor, the two ceramic capacitors have the same capacitance. Therefore, the currents ISNS and IREF have substantially the same value. When the value of the voltage VSNS of FIG. 1 between the terminals of the second ceramic capacitor is different from the value of the voltage VIN across the terminals of the first ceramic capacitor, the two ceramic capacitors have different capacitances. Therefore, the currents ISNS and IREF have different values.

The circuit 10 comprises a circuit 32 configured to compare the currents ISNS and IREF, and provide an output value VOUT, for example a voltage, proportional to the difference between the currents ISNS and IREF. For example, the voltage VOUT is at a first value if the currents ISNS and IREF are substantially equal, and is at a second value, or at one of several second values, if the currents ISNS and IREF have different values.

The circuit 32 comprises an input coupled, preferably connected, to the output 30*a* and another input coupled, preferably connected, to the output 30*b*. The circuit 32 further comprises an output on which is generated the voltage VOUT.

The circuit 10 comprises the feedback regulator circuit 28, generating the voltage VSNS. The circuit 28 for example generates the value of the voltage VSNS depending on the value of the voltage VOUT. Therefore, the circuit 28 for example comprises an input coupled, preferably connected, to the output of the circuit 32.

Figure 3:
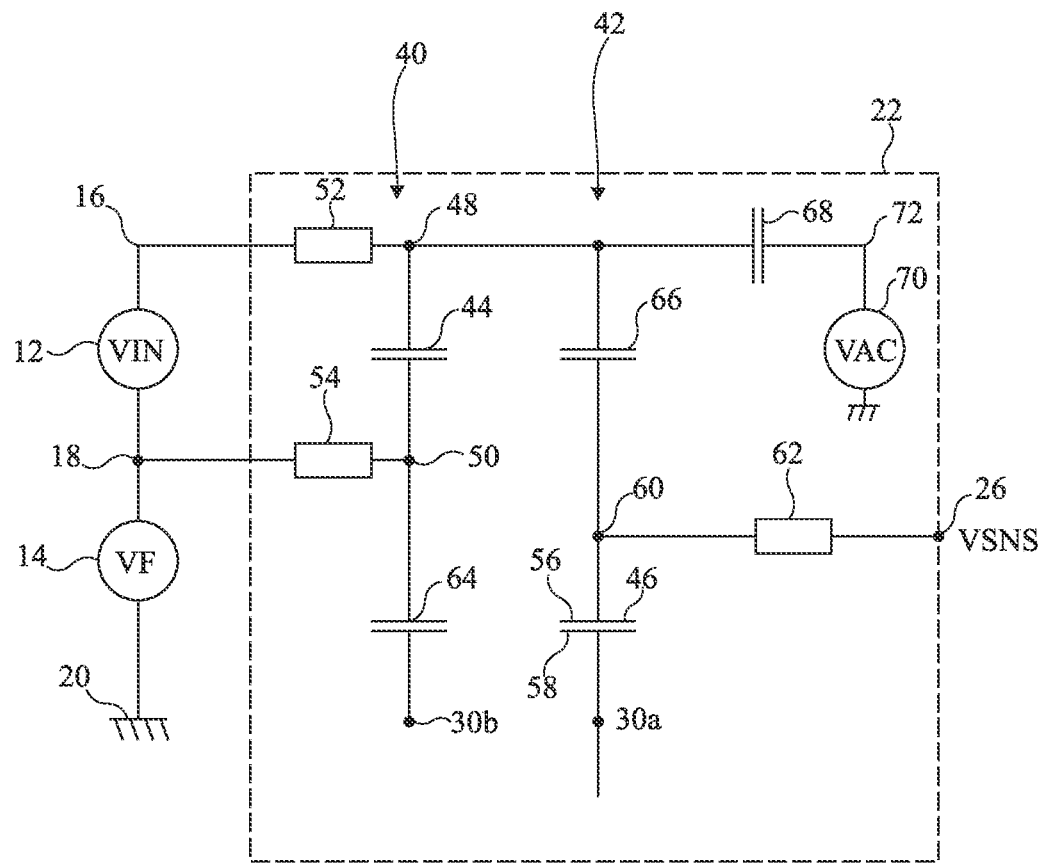
FIG. 3 schematically illustrates a circuit of the embodiment of FIG. 1 in more detail.

FIG. 3 schematically illustrates an example implementation of the circuit 22 of FIG. 1. FIG. 3 also illustrates the floating voltage, represented by the sources 12 and 14.

As described in relation with FIG. 1, the circuit 22 comprises two branches 40 and 42, each comprising a ceramic capacitor. The branch 40 comprises a ceramic capacitor 44. The branch 42 comprises a ceramic capacitor 46.

The ceramic capacitors 44 and 46 are substantially identical to each other. In other words, the ceramic capacitors 44 and 46 have substantially the same dimensions, and have, after manufacturing, substantially the same capacitance. More generally, the ceramic capacitors 44 and 46 behave in an identical manner to the application of a DC voltage across their terminals. In other words, the variations of the capacitance of the ceramic capacitors 44 and 46 as a function of the DC voltage across their terminals are substantially identical.

The floating voltage VIN is applied across the terminals of the ceramic capacitor 44. Therefore, the capacitor 44 is coupled between the node 16 and the node 18. In other words, a terminal of the capacitor 44 is coupled to the node 16 and another terminal of the capacitor 44 is coupled to the node 18. For example, each of the terminals of the capacitor 44 is coupled to the node 16 or 18 by a resistor. In other words, a terminal of the capacitor 44 is coupled, preferably connected, to a node 48, and another terminal of the capacitor 44 is coupled, preferably connected, to a node 50. The node 48 is coupled to the node 16 by a resistor 52. The node 50 is coupled to the node 18 by a resistor 54. A terminal of the resistor 52 is coupled, preferably connected, to the node 48 and another terminal of the resistor 52 is coupled, preferably connected, to the node 16. A terminal of the resistor 54 is coupled, preferably connected, to the node 50 and another terminal of the resistor 54 is coupled, preferably connected, to the node 18. The resistors are used to provide high impedance AC isolation of the voltage VIN and the feedback voltage VSNS. Therefore, the values of the impedance of the resistors are for example higher, for example at least ten times higher, than the impedance of the capacitors at the frequency of the AC voltage VAC.

Preferably, the resistors 52 and 54 are substantially identical to each other. In other words, the values of resistance of the resistors 52 and 54 are substantially equal.

The voltage VSNS is applied across the terminals of the ceramic capacitor 46. Therefore, the capacitor 46 is coupled between the node 26 and the node 30*a*. The node 30*a* is coupled, preferably connected, to the reference node 20. In other words, a terminal 56 of the capacitor 46 is coupled to the node 26 and another terminal 58 of the capacitor 46 is coupled, preferably connected, to the node 30*a*. The terminal 56 is coupled, preferably connected, to a node 60. The node 60 is coupled to the node 26 by a resistor 62. A terminal of the resistor 62 is coupled, preferably connected, to the node 60 and another terminal of the resistor 62 is coupled, preferably connected, to the node 26.

The branch 40 further comprises a coupling capacitor 64. The capacitors 44 and 64 of the branch 40 are coupled in series between the node 48 and the node 30*b*. In other words, the capacitor 64 is coupled between the node 48 and the node 50 and the capacitor 64 is coupled between the node 50 and the node 30*b*. A terminal of the capacitor 64 is coupled, preferably connected, to the node 50 and another terminal of the capacitor 64 is coupled, preferably connected, to the node 30*b*.

The branch 42 further comprises a coupling capacitor 66. The capacitors 46 and 66 of the branch 42 are coupled in series between the node 48 and the node 30*a*. In other words, the capacitor 66 is coupled between the node 48 and the node 60 and the capacitor 46 is coupled between the node 60 and the node 30*a*. A terminal of the capacitor 66 is coupled, preferably connected, to the node 60 and another terminal of the capacitor 66 is coupled, preferably connected, to the node 48.

In other words, each branch 40, 42 comprises two capacitors in series, the capacitors 44 and 64 for the branch 40 and the capacitor 46 and 66 for the branch 42. The set of capacitors 44 and 64 is coupled between the nodes 48 and 20 in parallel with the set of capacitors 46 and 66.

The capacitors 64 and 66 are substantially identical to each other. In other words, the capacitors 64 and 66 have substantially the same dimensions, and have, after manufacturing, substantially the same capacitance.

The capacitors 64 and 66 may be ceramic capacitors, in which case the capacitors 64 and 66 behave in an identical manner to the application of a DC voltage across their terminals. In other words, the variations of the capacitance of the ceramic capacitors 64 and 66 as a function of the DC voltage across their terminals are substantially identical. Alternatively, the capacitors 64 and 66 may be another type of capacitor.

In normal operations, voltages across the capacitor 64 and across the capacitor 66 are each substantially equal to the floating voltage VF.

The node 48 is also coupled to the node 72 by a capacitor 68 and an alternative voltage source 70, having a phase PH, allowing the generation of a current substantially equal in the two branches if the impedances of both branches are substantially equal. The capacitor 68 is coupled between the node 48 and a node 72. The source 70 is coupled between the node 72 and the node 20. In other words, a terminal of the capacitor 68 is coupled, preferably connected, to the node 48 and another terminal of the capacitor 68 is coupled, preferably connected, to the node 72. A terminal of the source 70 is coupled, preferably connected, to the node 20 and another terminal of the source 70 is coupled, preferably connected, to the node 72.

Figure 4:
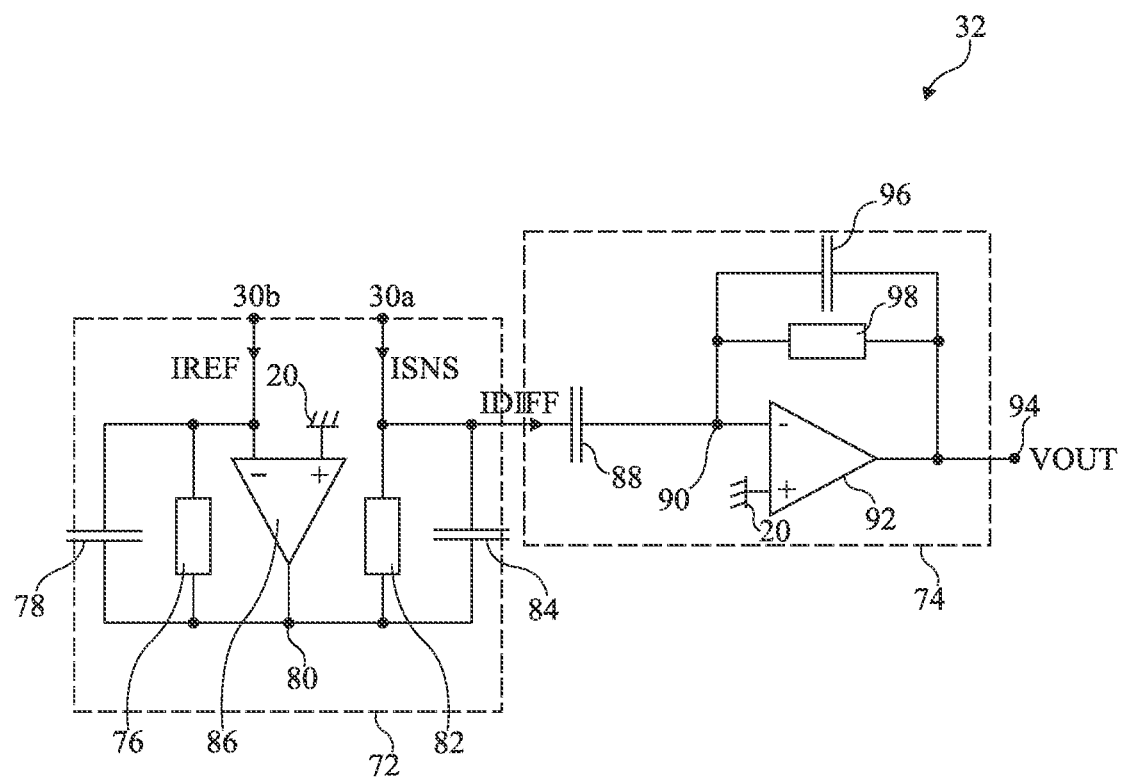
FIG. 4 schematically illustrates another circuit of the embodiment of FIG. 1 in more detail.

FIG. 4 schematically illustrates an example implementation of the circuit 32 of FIG. 1.

The circuit 32 comprises a circuit 72 configured to generate a current IDIFF representative of the difference between the AC current IREF and the AC current ISNS, for example substantially equal to the subtraction of the current ISNS from the current IREF. The circuit 32 further comprises an AC current amplifier circuit 74 configured to provide the voltage VOUT proportional to the different between the currents IREF and ISNS. The high resistance of the resistor 98 maintains the average (DC) voltage VOUT at the reference value GND.

The circuit 72 comprises a resistor 76 and a capacitor 78 coupled in parallel between the node 30*b* and a node 80. In other words, a terminal of the resistor 76 is coupled, preferably connected, to the node 30b and another terminal of the resistor 76 is coupled, preferably connected, to the node 80. A terminal of the capacitor 78 is coupled, preferably connected, to the node 30b and another terminal of the capacitor 78 is coupled, preferably connected, to the node 80. In other words, the resistor 76 and the capacitor 78 are both coupled in series with the capacitors 44 and 64 of the branch 40 (FIG. 3).

Similarly, the circuit 72 comprises a resistor 82 and a capacitor 84 coupled in parallel between the node 30a and a node 80. In other words, a terminal of the resistor 82 is coupled, preferably connected, to the node 30a and another terminal of the resistor 82 is coupled, preferably connected, to the node 80. A terminal of the capacitor 84 is coupled, preferably connected, to the node 30a and another terminal of the capacitor 84 is coupled, preferably connected, to the node 80. In other words, the resistor 82 and the capacitor 84 are both coupled in series with the capacitors 46 and 66 of the branch 42 (FIG. 3).

The resistor 76 and the resistor 82 are substantially identical to each other. In other words, the values of the resistances of the resistors 76 and 82 are substantially equal. Similarly, the capacitors 78 and 84 are substantially identical to each other. In other words, the values of the capacitances of the capacitors 78 and 84 are substantially equal.

The circuit 72 further comprises an operational amplifier 86. The operational amplifier 86 comprises an inverting input (−) coupled, preferably connected, to the node 30b. The operational amplifier 86 comprises a non-inverting input (+) coupled to the reference node 20. The operational amplifier comprises an output coupled, preferably connected, to the node 80.

The AC amplifier circuit 74 comprises a capacitor 88. The capacitor 88 is coupled between the node 30a and a virtual ground node 90. In other words, a terminal of the capacitor 88 is coupled, preferably connected, to the node 30a and another terminal of the capacitor 88 is coupled, preferably connected, to the node 90. The current IDIFF, representative of the difference between the currents IREF and ISNS, flows through the capacitor 88.

The circuit 74 comprises an operational amplifier 92. The operational amplifier 92 comprises an inverting input (−) coupled to the node 30a. The operational amplifier 92 comprises a non-inverting input (+) coupled, preferably connected, to the reference node 20. The operational amplifier 92 comprises an output coupled, preferably connected, to the output node 94 of the circuit 32 on which is applied the output voltage VOUT.

The circuit 74 comprises a capacitor 96 and a resistor 98 coupled in parallel between the node 90 and the node 94. In other words, a terminal of the resistor 98 is coupled, preferably connected, to the node 90 and another terminal of the resistor 98 is coupled, preferably connected, to the node 94. A terminal of the capacitor 96 is coupled, preferably connected, to the node 90 and another terminal of the capacitor 96 is coupled, preferably connected, to the node 94.

When the voltage VSNS is substantially equal to the voltage VIN, the currents ISNS and IREF are equal and the current IDIFF is equal to zero. The voltage VOUT, on the output of the operational amplifier 92, is therefore equal to zero.

In other words, the voltage VOUT is substantially equal to $$-\frac{2*VAC}{CS}*\Delta C,$$

where $\Delta C$ corresponds to the difference in capacitance value between the capacitances of the branches 40 and 42, VAC is the AC voltage generated by the source 70 and CS is the constant value of the capacitance of the feedback capacitor of the amplifier 74. When the voltage VSNS is substantially equal to the voltage VIN, the capacitance values of the capacitors 44 and 46 are equal, and the voltage VOUT is equal to zero.

Figure 5:
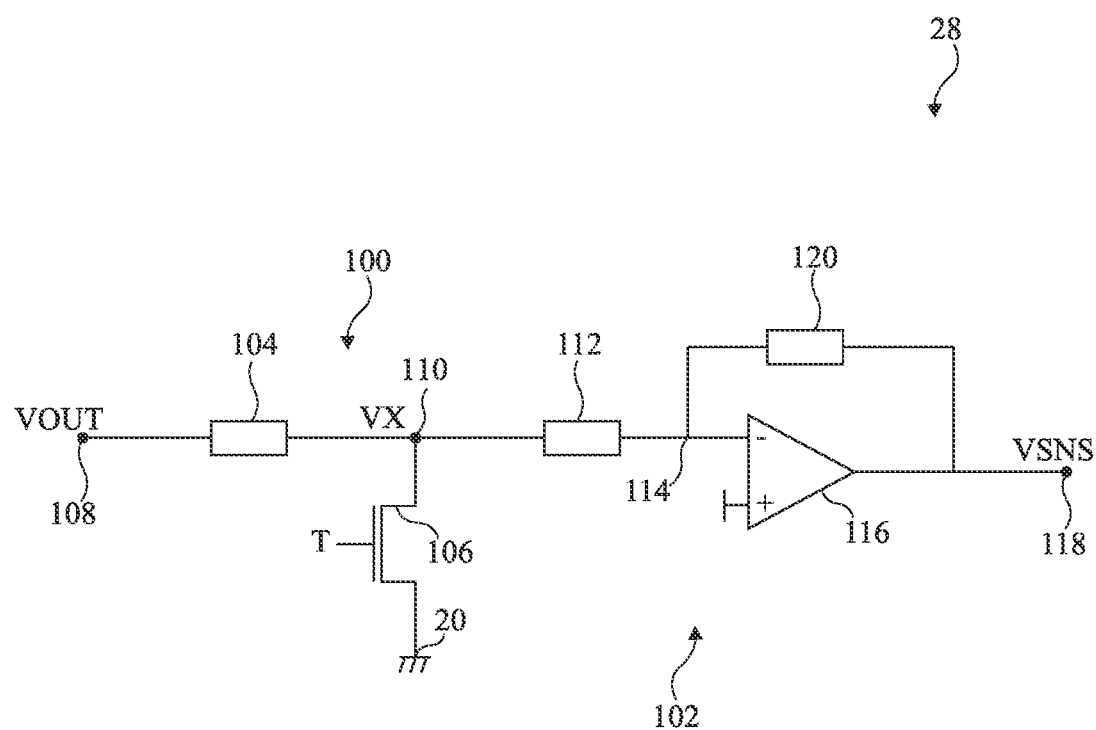
FIG. 5 schematically illustrates yet another circuit of the embodiment of FIG. 1 in more detail.

FIG. 5 schematically illustrates an example implementation of the circuit 28 of FIG. 1.

The circuit 28 comprises a phase discriminator 100 and an error amplifier 102.

The phase discriminator 100 comprises a resistor 104 and a transistor 106.

The resistor 104 is coupled between an input node 108, on which is applied the voltage VOUT, and a node no. In other words, a terminal of the resistor 104 is coupled, preferably connected, to the node 108, and another terminal of the resistor 104 is coupled, preferably connected, to the node no.

The transistor 106 is coupled between the node no and the reference node 20. In other words, a terminal of the transistor 106 is coupled, preferably connected, to the node no and another terminal of the transistor 106 is coupled, preferably connected, to the node 20. The control terminal of the transistor 106 is coupled, preferably connected, to a circuit, not represented in FIG. 5, generating a control signal T of the transistor 106. The control signal T is a square periodic signal having the same frequency and the same phase PH than that of the source 70 (FIG. 3).

The transistor 106 allows to pass only one half-period of the voltage VOUT in order to generate a rectified signal VX on the node 110. In other words, the transistor allows to detect the phase out of the AC voltage VOUT. This is useful to determine the signum of the difference between the currents ISNS and IREF.

The error amplifier 102 comprises a resistor 108 coupled between the node 110 and a node 114. In other words, a terminal of the resistor 112 is coupled, preferably connected, to the node 110 and another terminal of the resistor 112 is coupled, preferably connected, to the node 114. The error amplifier 102 comprises an operational amplifier 116. The operational amplifier 116 comprises an inverting input (−) coupled, preferably connected, to the node 114 and a non-inverting input (+) coupled, preferably connected, to the reference node 20. The operational amplifier 116 further comprises an output coupled, preferably connected, to a node 118 on which is generated the output voltage VSNS. The error amplifier 116 further comprises a component 120, for example a resistor or a capacitor, coupled between the node 114 and the node 118. In other words, a terminal of the component 120 is coupled, preferably connected, to the node 114 and another terminal of the component 120 is coupled, preferably connected, to the node 118. If the component 120 is a resistor, as in FIG. 5, the error amplifier 102 is proportional and if the component 120 is a capacitor, the error amplifier 102 is an integrator.

An advantage of the embodiments described is that it is possible to correctly and precisely measure a floating voltage of high or negative value with galvanic (DC) isolation of the measured voltage source VIN.

Another advantage of the embodiments described is that the act of measuring of the floating voltage does not impact the value of the floating voltage because its DC load is equal to zero.

Various embodiments and variants have been described. Those skilled in the art will understand that certain features of these embodiments can be combined, and that other variants are possible.

Finally, the practical implementation of the embodiments and variants described herein is within the capabilities of those skilled in the art based on the functional description provided hereinabove.

What is claimed is:

1. A circuit comprising:
a first branch coupled between a first node and a second node, the first branch comprising a first ceramic capacitor, the first ceramic capacitor comprising terminals configured to receive a first voltage applied therebetween;
a second branch coupled between the first node and a third node, the second branch comprising a second ceramic capacitor that is substantially identical to the first ceramic capacitor, the second ceramic capacitor comprising terminals configured to receive a second voltage applied therebetween; and
a control circuit configured to modify the second voltage until a first current passing through the second node is substantially equal to a second current passing through the third node.

2. The circuit of claim 1, wherein the first branch and the second branch are substantially identical to each other.

3. The circuit of claim 1, wherein the first branch further comprises a third ceramic capacitor coupled in series with the first ceramic capacitor between the first and second nodes, and wherein the second branch further comprises a fourth ceramic capacitor coupled in series with the second ceramic capacitor between the first and third nodes.

4. The circuit of claim 3, wherein the third ceramic capacitor and the fourth ceramic capacitor are substantially identical to each other.

5. The circuit of claim 1, further comprising an alternating voltage source coupled to the first node.

6. The circuit of claim 5, wherein the control circuit comprises a phase discriminator and an error amplifier, the phase discriminator comprising:
a resistor coupled between a fourth node and a fifth node, wherein the circuit is configured so that a third voltage is applied to the fourth node, the third voltage being representative of a difference between the first current and the second current; and
a transistor coupled between the fifth node and a reference node, the transistor coupled to receive a control signal that is a binary periodic signal having the same frequency and phase as the alternating voltage source.

7. The circuit of claim 1, further comprising a comparison circuit coupled to the second node and the third node, the comparison circuit configured to generate a third voltage that is representative of a difference between the first current and the second current.

8. The circuit of claim 7, wherein the comparison circuit comprises:
a further circuit configured to generate a third current, the third current substantially equal to the difference between the first current and the second current; and an integrator circuit configured to receive the third current as an input.

9. The circuit of claim 8, wherein the further circuit comprises:
a first resistor and a first capacitor coupled in parallel between the second node and a fourth node;
a second resistor and a second capacitor coupled in parallel between the third node and the fourth node; and
an operational amplifier comprising an inverting input, a non-inverting input, and an output, the inverting input coupled to the second node, the non-inverting input coupled to a reference node, the output coupled to the fourth node;
wherein the first and second resistors have the same resistance as each other; and
wherein the first and second capacitors have the same capacitance as each other.

10. The circuit of claim 1, wherein the control circuit comprises a phase discriminator and an error amplifier.

11. The circuit of claim 10, wherein the phase discriminator comprises:
a resistor coupled between a fifth node and a sixth node, wherein the circuit is configured so that a third voltage is applied to the fifth node, the third voltage being representative of a difference between the first current and the second current; and
a transistor coupled between the sixth node and a reference node.

12. The circuit of claim 1, wherein the first voltage is a floating voltage.

13. A circuit comprising:
a first ceramic capacitor having a first terminal and a second terminal;
a voltage source coupled across the first and second terminals of the first ceramic capacitor;
a second ceramic capacitor having a first terminal and a second terminal, the first terminal coupled to the first terminal of the first ceramic capacitor, wherein the second ceramic capacitor is substantially identical to the first ceramic capacitor; and
a control circuit configured to apply a second voltage across the first and second terminals of the second ceramic capacitor and to modify the second voltage until a first current passing through the first ceramic capacitor is substantially equal to a second current passing through the second ceramic capacitor.

14. The circuit of claim 13, further comprising a third ceramic capacitor coupled in series with the first ceramic capacitor and a fourth ceramic capacitor coupled in series with the second ceramic capacitor, wherein the third ceramic capacitor and the fourth ceramic capacitor are substantially identical to each other.

15. The circuit of claim 13 further comprising a comparison circuit coupled to the first ceramic capacitor and the second ceramic capacitor, the comparison circuit configured to generate a third voltage that is representative of a difference between the first current and the second current, wherein the control circuit is configured to modify the second voltage until the third voltage is zero.

16. The circuit of claim 15, wherein the control circuit comprises:
a differencing circuit configured to generate a third current based on the third voltage; and
an integrator circuit configured to integrate the third current and generate the second voltage.

17. A method comprising:
applying a first voltage across terminals of a first ceramic capacitor, the first ceramic capacitor being part of a first branch coupled between a first node and a second node;
applying a second voltage across terminals of a second ceramic capacitor that is substantially identical to the first ceramic capacitor, the second ceramic capacitor being part of a second branch coupled between the first node and a third node; and
modifying the second voltage until a first current passing through the second node is substantially equal to a second current passing through the third node.

18. The method of claim 17, further comprising comparing the first voltage to the second voltage, wherein modifying the second voltage comprises modifying the second voltage until a difference between the first voltage and the second voltage is zero.

19. The method of claim 17 further comprising:
measuring a difference between the first current and the second current; and
integrating the difference between the first current and the second current to obtain a third voltage; and
amplifying the third voltage to obtain the second voltage.

20. The method of claim 17, wherein the first voltage is a floating voltage.

* * * * *